United States Patent [19]

Anthony et al.

[11] 4,040,869

[45] Aug. 9, 1977

[54] HIGH VOLTAGE DEEP DIODE POWER SEMICONDUCTOR SWITCH

[75] Inventors: Thomas R. Anthony; Harvey E. Cline, both of Schenectady, N.Y.

[73] Assignee: General Electric Company, Schenectady, N.Y.

[21] Appl. No.: 678,293

[22] Filed: Apr. 19, 1976

Related U.S. Application Data

[60] Division of Ser. No. 556,709, March 10, 1975, Pat. No. 3,988,767, which is a continuation of Ser. No. 411,019, Oct. 30, 1973, abandoned.

[51] Int. Cl.$^2$ .................. H01L 7/00; H01L 29/00; H01L 29/74; H01L 23/32
[52] U.S. Cl. .................................. 148/1.5; 357/37; 357/38; 357/60; 357/76; 357/88; 357/89; 357/90
[58] Field of Search ................ 357/37, 38, 60, 76, 357/88, 89, 90; 148/1.5

[56] References Cited

U.S. PATENT DOCUMENTS

| | | | |
|---|---|---|---|
| 2,813,048 | 11/1957 | Pfann | 357/60 |
| 3,514,715 | 5/1970 | Kosonocky | 357/76 |

Primary Examiner—Edward J. Wojciechowicz
Attorney, Agent, or Firm—Donald M. Winegar; Joseph T. Cohen; Jerome C. Squillaro

[57] ABSTRACT

A semiconductor switch is a lamellar body of semiconductor material having two major opposed surfaces and at least one group of four regions of alternate type conductivity. At least three of the four regions have recrystallized semiconductor material having a solid solubility of metal therein to impart the type conductivity thereto. Each of the first and third regions have the same type conductivity but different levels of impurity concentration. Each of the second and fourth regions have the same type conductivity but different levels of impurity concentration.

18 Claims, 9 Drawing Figures

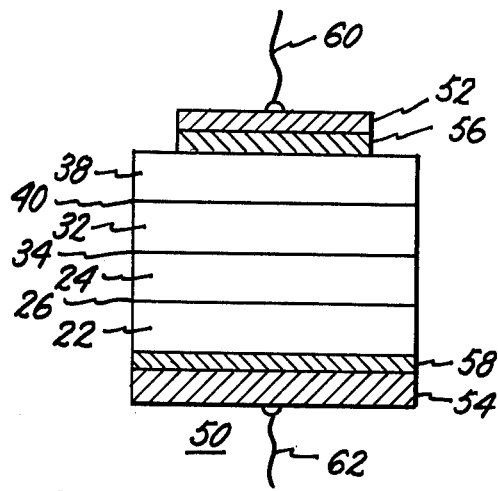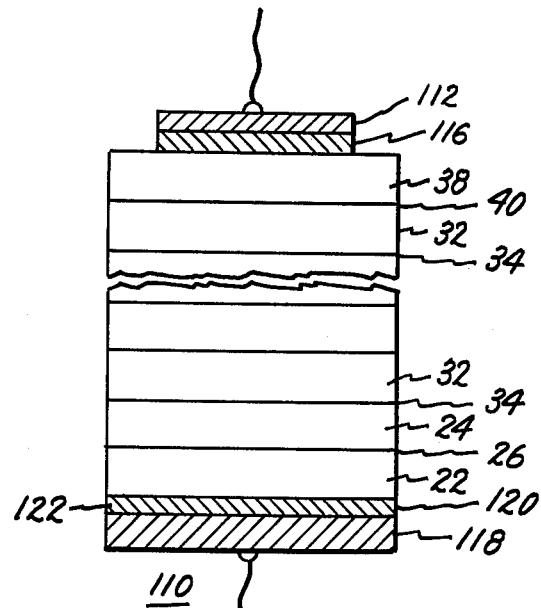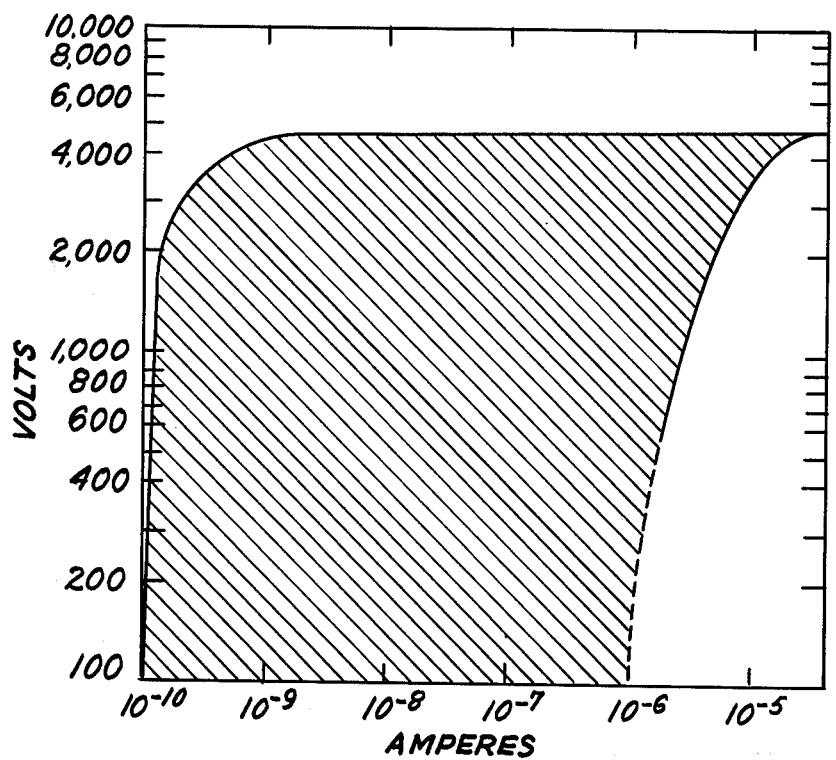

HIGH VOLTAGE DEEP DIODE POWER SEMICONDUCTOR SWITCH

CROSS-REFERENCE TO RELATED APPLICATION

This application is a division of application Ser. No. 556,709, filed Mar. 10, 1975, and now U.S. Pat. 3,988,767 which, in turn, was a continuation of application Ser. No. 411,019, filed Oct. 30, 1973, and now abandoned.

BACKGROUND OF THE INVENTION

1. Field of the Invention:
This invention relates to high voltage semiconductor switches and method of making the same.

2. Description of the Prior Art
A semiconductor switch may be produced by several different junction-forming techniques. Suitable techniques inclue alloying, diffusion and epitaxial growth methods. Diffusion and alloying have proved to be the most popular methods because they lend themselves to the economical mass production of semiconductor switches. However, both methods result in P-N junctions which are not very sharply defined although they may meet the requirements of a "step" P-N junction. Also, the concentration profile of the P-N junction varies with the process temperature employed. In addition, the diffusion process results in a region having non-uniform impurity concentration throughout the region.

Regions formed by alloying techniques are limited in depth and area covered because the process requires the formation of a molten mixture of the semiconductor material and either a donor or an acceptor material, as an impurity material, and solidification of the same to form the desired region. Also, the molten material must be prevented from flowing outside of a confined area. Otherwise, the device may be inoperable. The material of the region that is formed is recrystallized material. However, the process is limited to that portion of the device immediately adjacent to an electrical contact. Most often, the alloying process is practiced when an electrical contact is affixed to the device.

In either case, the diffusion and alloying techniques are practiced only through a surface area. Because of the elapsed time and high temperature required for the diffusion processes, the resulting regions produced thereby are limited in size. Any additional high temperature processing of the processed body readily afffects the P-N junctions which have been previously formed and tends to enlarge the previously formed regions.

Epitaxial growth techniques overcome some of the difficulties encountered by the diffusion and alloying techniques. Regions of fairly uniform resistivity are easily grown. However, the temperatures and the rate of growth of material are factors which limit the thickness that a region can be grown economically. The P-N junction which results from epitaxial growth techniques is more sharply defined than the junctions made by alloying and diffusion.

In all instances, however, theoretical breakdown voltages and operating characteristics are not achieved. High temperatures for extended periods of time adversely affect the crystalline structure of the substrate material. It causes the P-N junction already present in the processed material to move and may also result in the out diffusion of dopant impurities thereby changing the resistivity of the region of semiconductor material involved. Additionally, the processes deposit impurities within or on surfaces of the regions and at the P-N junctions thereby detrimentally affecting the operating characteristics of the devices.

None of the semiconductor switches manufactured to date have several regions made from recrystallized substrate material. In addition, the semiconductor switches have usually been limited to four regions for semiconductor control rectifier applications and to five regions for bidirectional switching applications. Such structural limitations have resulted from extensive process time and high process temperatures encountered in making the devices.

An object of this invention is to provide a new and improved semiconductor switch which overcomes the deficiencies of the prior art devices.

Another object of this invention is to provide a new and improved semiconductor switch having at least one group of four opposite type conductivity, at least three of the regions being of recrystallized semiconductor material having solid solubility of a dopant impurity therein to impart the conductivity type thereto.

Another object of this invention is to provide a new and improved semiconductor switch wherein the P-N junctions formed therein are well defined and have a minimum concentration profile width to provide a step P-N junction.

Other objects of this invention will, in part, appear hereinafter.

BRIEF DESCRIPTION OF THE INVENTION

In accordance with the teachings of this invention, there is provided a semiconductor switch comprising a lamellar body of semiconductor material having two major opposed end surfaces and at least one group of four regions of alternate and opposite type conductivity. Each of the first and third regions of each group has a first type conductivity and a different level of impurity concentration. Each of the second and fourth regions of each group has a second and opposite type conductivity and a different level of impurity concentration. A P-N junction is formed by the contiguous surfaces of each pair of regions of opposite type conductivity. A first electrical contact is affixed to both the first region of the group and one end surface of the body. A second electrical contact affixed to both the fourth region of one group and the other end surface of the body. A P-N junction is formed by the contiguous surfaces of pairs of regions of opposite type conductivity. An electrical contact is affixed to each of the top and bottom surfaces of the body.

DESCRIPTION OF THE DRAWINGS

FIG. 7 is an elevation view, partly in cross-section, of a semiconductor device made in accordance with the teachings of this invention;

FIG. 8 is an elevation view, partly in cross-section, of another semiconductor device made in accordance with the teachings of this invention, and FIG. 9 is a graph of the electrical characteristics of the device of FIG. 8 indicating its breakover voltage, breakover current and turnon current.

DESCRIPTION OF THE INVENTION

Figure 1:
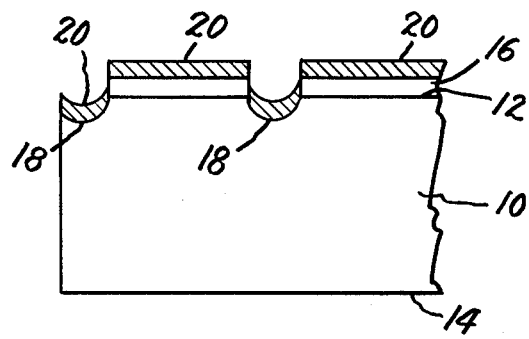
FIGS. 1 through 6 are elevation views, in cross-section, of a body of semiconductor material processed in accordance with the teachings of this invention.

With reference to FIG. 1, there is shown a body 10 of single crystal semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element and a compound of a Group III element and a Group V element. In order to describe the invention more explicitly, the body is said to be of silicon semiconductor material.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 15. The resist is dried by baking at a temperature of about 80° C. A suitable mask of spaced lines of a predetermined thickness and spaced a predetermined distance apart is disposed on the layer of photoresist and exposed to ultraviolet light. After exposure, the layer of photoresist is washed in xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a solution of 1 part of hydrogen peroxide and 1 part of concentrated sulphuric acid immediately after mixing.

Selective etching of the exposed surface of body 10 is accomplished with a mixed acid solution. The mixed acid solution is 10 parts by volume nitric acid 70%, 4 parts by volume acetic acid, 100%, and 1 part by volume hydrofluoric acid, 48%. At a temperature of from 20° C to 30° C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25° C will result in a trough 18 of from 25 to 30 microns in depth for a window width of from 10 to 500 microns. The etched body 10 is rinsed in distilled water and blown dry. Preferably, a gas, such for example as, freon, argon and the like, is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impart a second and opposite type conductivity to the material of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P+-type conductivity regions in N-type conductivity silicon semiconductor material. Prior to migrating the metal wires in the troughs 18 through the body of silicon 10, the excess metal of the layer 20 is removed from the silicon oxide 16 by such suitable means as grinding away the excess metal with a 600 grit carbide paper or selective chemical etching.

It has been discovered that the vapor deposition of the layer 20 of aluminum metal should be performed at a pressure of approximately $1 \times 10^{-5}$ torr but not more than $5 \times 10^{-5}$ torr. When the pressure is greater than $5 \times 10^{-5}$ torr, we have found that in the case of aluminum metal deposited in the troughs 18, the aluminum does not penetrate into the silicon and migrate through the body 10. It is believed that the layer of aluminum is saturated with oxygen which prevents reduction of a thin air-formed silicon oxide layer on the silicon body 10, formed when the silicon surface is exposed to air, by the aluminum and thus prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not as desirable as sputtered aluminum appears to be saturated with oxygen from the process. The preferred methods of depositing aluminum on the silicon body 10 are by the electron beam method and the like wherein little, if any, oxygen can be trapped in the aluminum.

The processed body 10 is placed in a thermal migration apparatus, not shown, and the metal wires in the troughs 18 are migrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 of from 700° C to 1350° C. The process is practiced for a sufficient length of time to migrate all these metal wires through the body 10. For example, for aluminum wires of 20 microns thickness, a therml gradient of 50° C/cm., a temperature of the body 10 of 1100° C a pressure of $1 \times 10^{-5}$ torr, a furnace time of less than 12 hours is required to migrate the wires through a silicon body 10 of one centimeter thickness.

The specific fundamentals of the temperature gradient zone melting process and apparatus therefore is not a part of this invention. For a more thorough understanding of the temperature gradient zone melting process employed in this invention and for a more thorough description of the apparatus employed for the process, one is directed to our following copending applications filed concurrently with this patent application and assigned to the same assignee of this invention: Method of Making Deep Diode Devices, Ser. No. 411,150 and now U.S. Pat. No. 3,901,736; High Velocity Thermal Migration Method of Making Deep Diodes, Ser. No. 411,021 and now U.S. Pat. No. 3,910,801; Deep Diode Devices and Method and Apparatus, Ser. No. 411,001, and now abandoned in favor of a continuation, Ser. No. 552,154; High Velocity Thermomigration Method of Making Deep Diodes, Ser. No. 411,015 and now U.S. Pat. No. 3,898,106 Deep Diode Device and Method, Ser. No. 411,009 and now U.S. Pat. No. 3,902,925; and Stabilized Droplet Method of Making Deep Diodes Having Uniform Electrical Properties, Ser. No. 411,008 and now U.S. Pat. No. 3,899,361.

Figure 2:
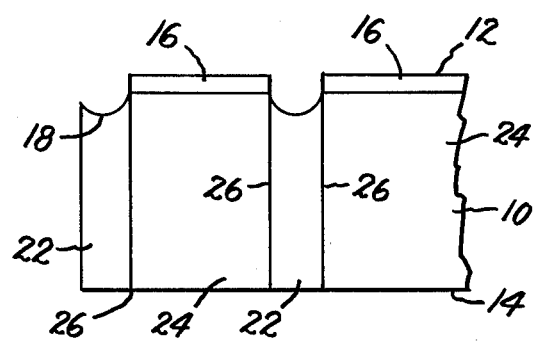

Upon completion of the temperature gradient zone melting process, the resulting processed body 10 is as shown in FIG. 2. The thermal migration of the metal wires in the troughs 18 through the body 10 produces a body 10 having a plurality of first spaced regions 22 of a second and opposite type conductivity than the body 10. Each region 22 is recrystallized material of the body 10 having solid solubility of aluminum therein. The recrystallized material of the regions 22 have an impurity concentration sufficient to obtain the desired conductivity. The thermal gradient across the thickness of the body 10 is sufficiently small at the temperature of practicing the thermal migration and the change of solid solubility of aluminum in silicon with temperature is very small in the same temperature range that the region 22 has a constant uniform level of impurity concentration throughout the entire planar region. The thickness of the region 22 is substantially constant over the entire region. The peripheral surface of each planar region 22 comprises in part the top surface 12, the bottom surface 14, and the peripheral side surface of the body 10.

Additionally, the body 10 is divided into a plurality of spaced regions 24 having the same, or first type conductivity as the body 10. A P-N junction 26 is formed by the contiguous surfaces of each pair of mutually adjacent regions 22 and 24 of opposite type conductivity. The P-N junction 26, as formed, are abrupt, distinct junctions. Each P-N junction concentration profile is approximately 18 microns in thickness.

Figure 3:
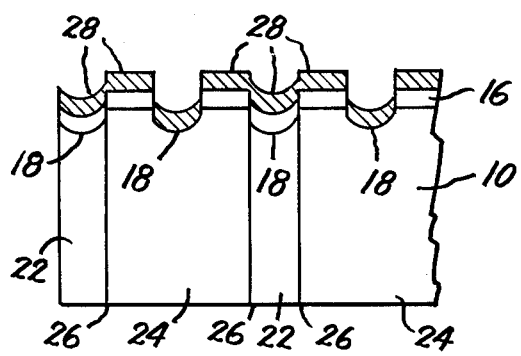
Figure 4:
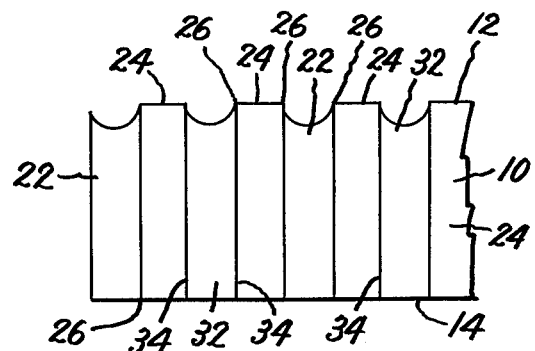

Referring now to FIGS. 3 and 4, the processed body 10 is again processed in the same manner as described with reference to FIGS. 1 and 2 except that a layer 28 of tin and aluminum is deposited on the layer 16 and selected etched surface areas of the body 10. After practicing the thermal gradient zone melting process in the same manner as before, P-type conductivity regions 32 are formed in the regions 24 of N-type conductivity silicon. The material of the regions 32 is recrystallized material of a portion of the region 24 with solid solubility of tin-aluminum therein. P-N junctions 34 are formed by the contiguous surfaces of regions 24 and 32 of opposite type conductivity.

Alternately by employment of suitable photolithographical techniques known to those skilled in the art, the aluminum and tin-aluminum wires may be migrated simultaneously.

Figure 5:
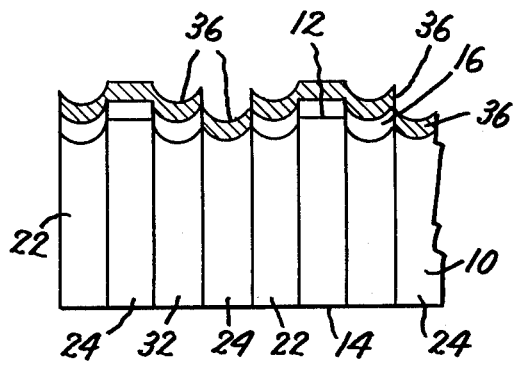
Figure 6:
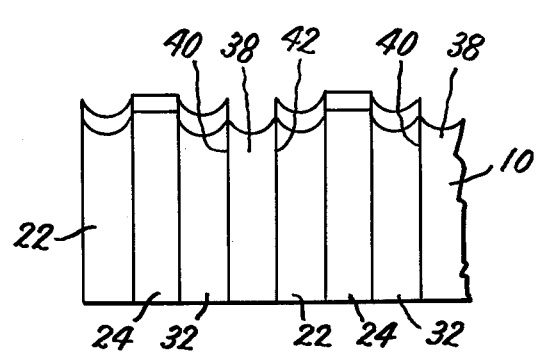

With references to FIGS. 5 and 6, the processed body 10 is further processed in the same manner as before except that a layer 36 of gold-antimony is deposited on the layer 16 of silicon oxide and selected etched surface areas of the processed body 10. Care is exercised to be sure that the gold-antimony wire which is migrated through the processed body 10 is sufficiently wide to overlay the mutually adjacent regions 22 and 32 to prevent an undesirable region 24 of N-type conductivity to exist between the regions in question. Upon completion of practicing the thermal migration of the gold-antimony wires through the body 10, selected ones of the regions 24 are recrystallized and contain solid solubility of the gold-antimony therein to impart a N+ -type conductivity to the new regions 38. A P-N junction 40 is formed by the contiguous surfaces of the regions 38 and 32 of opposite type conductivity. A P-N junction 42 is formed by the contiguous surfaces of the regions 38 and 22 of opposite type conductivity. All of the P-N junctions 38, 40 and 34 are abrupt, distinct junctions.

The resulting structure is a lamellar body of one large semiconductor material having a plurality of groups of four regions of alternate type conductivity as shown in FIG. 6. As described in this specification, the lamellar body has groups of P+-N-P-N+ configuration. The resistivities of the corresponding regions 22, 24, 32 and 38 are respectively approximately $7 \times 10^{-1}$ ohm-centimeter, 10 ohm-centimeter (the starting material), $3 \times 10^{-1}$ ohm-centimeter and $1 \times 10^{-3}$ ohm-centimeter. The carrier concentration of the various regions 22, 24, 32 and 38 are respectively $2 \times 10^{19}$ atoms per cubic centimeter, $5 \times 10^{14}$ atoms per cubic centimeter, $1 \times 10^{17}$ atoms per cubic centimeter and $7 \times 10^{19}$ atoms per cubic centimeter. The structure may be divided into a plurality of chips having a similar configuration.

Referring now to FIG. 7, there is shown a semiconductor switch 50 embodying the basic structure of the processed body 10 as a 4-region device. The semiconductor switch 50 has the four alternate regions of opposite type conductivity. P-N junctions 26, 34 and 40 formed by the contiguous surfaces of the respective planar regions 22 and 24, and 32 and 38. The completed semiconductor switch 50 is as shown in FIG. 8 wherein electrical contacts 52 and 54 are affixed by ohmic solder layers 56 and 58 respectively to the respective regions 38 and 22. An electrical lead 60 is affixed to contact 52 and an electrical lead 62 is affixed to contact 54.

A high voltage semiconductor switch is also made from the processed body 10 of FIG. 6. The number of groups of the four regions 22, 24, 32 and 38 which are necessary for the desired operating voltage of the device are determined and the desired configuration is cut from the body 10. For example, with reference to FIG. 8, a semiconductor switch 110 comprises a plurality of groups of four regions 22, 24, 32 and 38 of alternate type conductivity functioning as a plurality of series connected semiconductor switches.

Each of the regions 22, 24, 32 and 38 is 13 mils, of 325 microns, in thickness having 5 groups of regions of alternate type conductivity of these aforesaid dimensions and having the physical dimensions of a length of 1 centimeter, a width of 0.2 centimeter and an overall thickness of 0.6 centimeter was prepared from the processed body 10 and tested electrically. A graph of the results of the electrical tests are shown in FIG. 9. The turn on current was $10^{-6}$ amperes, the breakdown voltage was 4.5 kilovolts and the breakdown current was $10^{-9}$ amperes.

The results achieved for the device 110 having the dimensions and characteristics described were unexpected. The excellent values obtained indicate that little contamination of the body 10 occurs during this novel temperature gradient zone melting process. Examination of all the P-N junctions 26, 34 and 40 revealed them to be well defined and about 18 microns in concentration profile width and producing a step junction.

Referring now to FIG. 8, the device 110 is completed by affixing a first electrical contact 112 to the top surface 114 of the device 110 by means of an ohmic solder layer 116. A second electrical contact 118 is affixed by a layer 118 of ohmic solder material to the bottom surface 120 of the device 110 by a layer 122 of ohmic solder material.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

The thermal migration of metal wires is preferably practiced in accordance with the planar orientations, thermal migration directions, stable wire directions and stable wire sizes of the following Table:

Table

| Wafer Plane | Migration Direction | Stable Wire Directions | Stable Wire Sizes |
|---|---|---|---|
| (100) | $<100>$ | $<011>$* | $<100$ microns |
|  |  | $<0\bar{1}1>$* | $<$ microns |
| (110) | $<110>$ | $<1\bar{1}0>$* | $<150$ microns |
| (111) | $<111>+$ | a) $<01\bar{1}>$ |  |
|  |  | $<\bar{1}0\bar{1}>$ | $<500$ microns |
|  |  | $<1\bar{1}0>$ |  |
|  |  | b) $<11\bar{2}>$* |  |
|  |  | $<\bar{2}11>$* | $<500$ microns |
|  |  | $<1\bar{2}1>$* |  |
|  |  | c) Any other direction in (111) plane |  |

*The stability of the migration wire is sensitive to the alignment of the thermal gradient with the $<100>$, $<110>$ and $<111>$ axis, respectively.
+Group a is more stable than group b which is more stablethan group c.

We claim as our invention:

1. A method for making a high voltage deep diode power semiconductor switch comprising the process steps of
   a. selecting a body of single crystal semiconductor material having two major opposed surfaces comprising, respectively, the top and bottom surfaces thereof, a first predetermined level of resistivity, a first predetermined type conductivity, and a preferred planar crystal structure orientation for at least one of the major opposed surfaces, the planar crystal structure orientation is one selected from the group consisting of (111), (100) and (110);
   b. orienting the body so that the vertical axis of the body is substantially aligned with a first crystal axis of the crystal structure of the material and which is substantially perpendicular to the at least one major opposed surface having the preferred planar crystal structure orientation;
   c. disposing a first array of metal wires having a selected configuration on a major surface of the body, the metal comprising at least one material suitable for imparting to a portion of the material of the body a second predetermined type conductivity and a second predetermined level of resistivity, each metal wire having a preferred stable wire direction which is dependent upon the planar orientation of the major surface and is oriented substantially parallel with a second preferred axis of the material of the body;
   d. heating the body and the first array of metal wires to a temperature sufficient to form an array of liquid wires of metal-rich semiconductor material on the major surface of the body;
   e. establishing a first thermal gradient in the body substantially parallel with the vertical axis of the body and the first crystal axis of the material of the body, the major surface having the array of liquid wires being at the lower temperature;
   f. migrating the array of liquid wires entirely through the body from the major surface of lower temperature to the major surface of higher temperature substantially parallel with the first crystal axis;
   g. forming in situ in the body a plurality of first spaced planar regions, each having two opposed major surfaces and consisting of recrystallized semiconductor material of the body having solid solubility of the metal of the liquid wire therein, as determined by the temperature of migration, the semiconductor material and the metal of the migrated wire, each first region being formed by the migration of one particular liquid wire, the level of concentration of the at least one material being sufficient to impart the second and opposite type conductivity and the second predetermined level of resistivity to each first spaced planar region;
   h. forming first and second P-N junctions at the respective abutting major surfaces of the material of each first spaced region and that of the body, each P-N junction being substantially perpendicular to the opposed major surfaces of the body and thereby forming a lamellar structure of a plurality of integral planar regions of alternate and opposite type conductivity;
   i. disposing a second array of metal wires having a selected configuration on a major surface of the body wherein each wire is disposed between a pair of the first planar regions, the metal comprising at least one material suitable for imparting to a portion of the material of the body a second predetermined type conductivity and a third predetermined level of resistivity, each metal wire having a preferred stable wire direction which is oriented substantially parallel to the second preferred axis of the material of the body;
   j. establishing a second thermal gradient in the body substantially parallel with the vertical axis of the body and the first crystal axis of the material of the body, the major surface having the array of liquid wires being at the lower temperature;
   k. migrating the array of liquid wires entirely through the body from the major surface of lower temperature to the major surface of higher temperature substantially parallel with the first crystal axis;
   l. forming in situ in the body a plurality of second spaced planar regions, each having two major opposed surfaces and consisting of recrystallized semiconductor material of the body having solid solubility of the metal of the liquid wire therein as determined by the temperature of migration, the semiconductor material of the body and the metal of the migrated wire, each second region being formed by the migration of one particular liquid wire, the level of concentration of the at least one material being sufficient to impart the second and opposite type conductivity and the third predetermined level of resistivity to each second spaced planar region;

m. forming third and fourth P-N junctions at the respective abutting major surfaces of the material of each second spaced region and that of the body, each third and fourth P-N junctions being substantially perpendicular to the opposed major surfaces of the body and thereby forming one or more groups of a lamellar structure of four integral planar regions of first and second planar regions and two regions of material of the body;

n. disposing a third array of metal wires having a selected configuration on a major surface of the body wherein each wire is disposed between, and overlaps a portion of each of, a pair of first and second spaced planar regions and the respective first and fourth P-N junctions therebetween, the metal comprising at least one material suitable for imparting to a portion of the material of the body a first type conductivity and a fourth predetermined level of resistivity, each metal wire having a preferred stable wire direction which is oriented substantially parallel to the second preferred axis of the material of the body;

o. establishing a third thermal gradient in the body substantially parallel with the vertical axis of the body and the first crystal axis of the material of the body, the major surface having the array of liquid wires being at the lower temperature;

p. migrating the array of liquid wires entirely through the body from the major surface of lower temperature to the major surface of higher temperature substantially parallel with the first crystal axis;

q. forming in situ in the body a plurality of third spaced planar regions, each having two major opposed surfaces and consisting of recrystallized semiconductor material of the body having solid solubility of the metal of the liquid wire therein as determined by the temperature of migration, the semiconductor material of the body and the metal of the migrated wire, each third region being formed by the migration of one particular liquid wire, the level of concentration of the at least one material being sufficient to impart the first type conductivity and the third predetermined level of resistivity to each third spaced planar region;

r. reforming the first and the fourth P-N junctions at the respective abutting major surfaces of the material of each third planar region and that material of the first planar region and that material of the second planar region;

s. dividing the processed body into at least one group of four integral planar regions of alternate and opposite conductivity forming a lamellar structure having in order the first planar region, a fourth planar region which consists of material of the body, the second planar region and the third planar region, and t. affixing an ohmic electrical contact to the first planar region and affixing an ohmic electric contact to the third planar region whereby the lamellar structure will function as a semiconductor switch when a voltage is impressed across the two ohmic electrical contacts.

2. The method of claim 1 including practicing the process step prior to the depositing of each of the metal arrays on the major surface of
selectively etching a selective portion of the major surface of the body to form an array of lineal trough-like depressions therein into which the metal is deposited.

3. The method of claim 1 wherein
the semiconductor material of the body is one selected from the group consisting of silicon, silicon carbide, gallium arsenide and germanium.

4. The process of claim 2 wherein
the metal is vapor deposited.

5. The process of claim 2 wherein
the preferred planar crystal orientation is (111), and the first crystal axis is $<111>$.

6. The process of claim 5 wherein
the material of the body is one selected from the group consisting of silicon, silicon carbide, germanium and gallium arsenide.

7. The process of claim 6 wherein
the material of the body is silicon of N-type conductivity, and
the metal of the wire comprises aluminum for forming the P-type regions.

8. The process of claim 7 wherein
the second preferred crystal axis is one selected from the group consisting of $<01\bar{1}>$, $<10\bar{1}>$, $<1\bar{1}0>$, $<11\bar{2}>$, $<\bar{2}11>$ and $<1\bar{2}1>$.

9. The process of claim 6 wherein
the second preferred crystal axis is one selected from the group consisting of $<01\bar{1}>$, $<10\bar{1}>$, $<1\bar{1}0>$, $<11\bar{2}>$, $<\bar{2}11>$ and $<1\bar{2}1>$.

10. The process of claim 2 wherein
the preferred planar crystal orientation is (100), the preferred first crystal axis is $<100>$, and the preferred second crystal axis is one selected from the group consisting of $<011>$ and $<0\bar{1}1>$.

11. The process of claim 10 wherein
the material of the body is one selected from the group consisting of silicon, silicon carbide, germanium and gallium arsenide.

12. The process of claim 11 wherein
the material of the body is N-type silicon, and the metal of the wire comprises aluminum for forming the P-type regions.

13. The process of claim 2 wherein
the preferred planar crystal structure orientation is (110).
the preferred first crystal axis $<110>$, and
the preferred second crystal axis $<1\bar{1}0>$.

14. The process of claim 13 wherein
the material of the body is one selected from the group consisting of silicon, silicon carbide, germanium and gallium arsenide.

15. The process of claim 14 wherein
the material of the body is N-type silicon, and
the metal of the wire comprises aluminum for forming the P-type regions.

16. The process of claim 2 wherein
the first and second planar regions are thermally migrated simultaneously.

17. The process of claim 2 wherein
the metal in the material of the first planar region is aluminum,
the metal in the material of the second planar region is tin and aluminum, the metal in the material of the third planar region is gold and antimony, the material of the body and the fourth planar region is silicon of N-type conductivity and the first level of resistivity is approximately 10 ohm-centimeter, the second level of resistivity is approximately $7 \times 10^{-3}$ ohm-centimeter, the third level of resistivity is approximately $3 \times 10^{-1}$ ohm-centimeter, and the fourth level of resistivity is approximately $1 \times 10^{-3}$ ohm-centimeter.

18. The process of claim 2 wherein the processed body is divided into at least two integral groups, each consisting of the four integral planar regions of alternate and opposite type conductivity, and affixing the first ohmic electrical contact to the first planar region of one group, and affixing the second ohmic electrical contact to the third planar region of the last integral group of four integral planar regions.

* * * * *